US012628293B2

(12) United States Patent
Bass et al.

(10) Patent No.: US 12,628,293 B2
(45) Date of Patent: May 12, 2026

(54) ELECTRONIC DEVICES WITH MOLDED POLYMER STRUCTURES

(71) Applicant: Apple Inc., Cupertino, CA (US)

(72) Inventors: Dakota A Bass, Santa Cruz, CA (US); Erik G de Jong, San Francisco, CA (US); Sameer Pandya, Sunnyvale, CA (US); Shang L Tsuei, San Jose, CA (US); Trent J Canales, Roseville, CA (US)

( * ) Notice: Subject to any disclaimer, the term of this patent is extended or adjusted under 35 U.S.C. 154(b) by 0 days.

(21) Appl. No.: 18/771,073

(22) Filed: Jul. 12, 2024

(65) Prior Publication Data

US 2024/0365488 A1      Oct. 31, 2024

Related U.S. Application Data

(63) Continuation of application No. 17/701,516, filed on Mar. 22, 2022, now Pat. No. 12,108,547.

(Continued)

(51) Int. Cl.
*H05K 5/02* (2006.01)
*G02B 6/42* (2006.01)
*H05K 5/00* (2006.01)

(52) U.S. Cl.
CPC ......... *H05K 5/0217* (2013.01); *G02B 6/4253* (2013.01); *H05K 5/0017* (2013.01)

(58) Field of Classification Search
CPC ............. H04M 1/0266; H04M 1/0268; H04M 1/0277; H05K 5/0217; H05K 5/0017; G02B 6/4253; G06F 1/1637; G06F 1/1652

(Continued)

(56) References Cited

U.S. PATENT DOCUMENTS 8,625,290 B2    1/2014  Wee et al.
8,723,824 B2    5/2014  Myers et al.
(Continued)

FOREIGN PATENT DOCUMENTS

CN        105789252 A    7/2016
CN        107910296 A    4/2018
(Continued)

OTHER PUBLICATIONS

Hera Daniel et al., "Flexible Packaging by Film-Assisted Molding for Microintegration of Inertia Sensors", Sensors 2017, Jun. 27, 2017, pp. 1-11, MDPI.

*Primary Examiner* — Timothy J Thompson
*Assistant Examiner* — Michael F McAllister
(74) *Attorney, Agent, or Firm* — Treyz Law Group, P.C.; David K. Cole

(57) ABSTRACT

An electronic device may have a display mounted in a housing. The display may have a display panel with an array of pixels on a flexible substrate. A display cover layer may overlap the display panel. The flexible substrate may have a protruding portion that forms a tail. When the display is mounted in the housing, the tail may be bent back on itself to create a bend. The bend may be embedded in molded polymer. The device may have structures that help prevent the display cover layer from being compressed inwardly towards the rear of the housing such as frame structures embedded in the molded polymer and/or housing sidewall structures. Optical components and optical waveguides may be embedded within the molded polymer. Mating chamfers on the display cover layer and housing may help seat the display cover layer in the housing.

20 Claims, 11 Drawing Sheets

Related U.S. Application Data

(60) Provisional application No. 63/164,949, filed on Mar. 23, 2021, provisional application No. 63/229,259, filed on Aug. 4, 2021.

(58) Field of Classification Search
USPC ........................................................ 361/807
See application file for complete search history.

(56) References Cited

U.S. PATENT DOCUMENTS

| | | | |
|---|---|---|---|
| 8,975,540 | B2 | 3/2015 | Mareno et al. |
| 9,089,056 | B2 | 7/2015 | Rayner |
| 9,195,108 | B2 | 11/2015 | Park et al. |
| 9,209,207 | B2 | 12/2015 | Park et al. |
| 9,244,300 | B2 | 1/2016 | Yu et al. |
| 9,286,024 | B2 | 3/2016 | Becze et al. |
| 9,307,816 | B2 | 4/2016 | Sartee et al. |
| 9,516,743 | B2 | 12/2016 | Kim et al. |
| 9,549,598 | B2 | 1/2017 | Rayner et al. |
| 9,568,800 | B1 | 2/2017 | Sprague |
| 9,680,205 | B2 | 6/2017 | Li et al. |
| 9,933,875 | B2 | 4/2018 | Martisauskas |
| 9,977,466 | B2 | 5/2018 | Kwon et al. |
| 10,133,428 | B2 | 11/2018 | Kim et al. |
| 10,134,540 | B2 | 11/2018 | Choi et al. |
| 10,631,437 | B2 | 4/2020 | Fournier et al. |
| 10,849,246 | B2 | 11/2020 | Hooten et al. |
| 11,159,660 | B2 | 10/2021 | Choi et al. |
| 11,637,919 | B2 * | 4/2023 | Baker .................. H04M 1/026 455/564 |
| 11,838,432 | B2 * | 12/2023 | Keen .................. H05K 5/0086 |
| 2012/0218219 | A1 | 8/2012 | Rappoport et al. |
| 2013/0076649 | A1 * | 3/2013 | Myers .................. G06F 3/0412 361/679.01 |
| 2013/0279088 | A1 | 10/2013 | Raff et al. |
| 2014/0152632 | A1 * | 6/2014 | Shedletsky ............ H10K 59/13 250/208.2 |
| 2015/0373864 | A1 | 12/2015 | Jung |
| 2015/0382446 | A1 | 12/2015 | Kwon et al. |
| 2016/0109852 | A1 | 4/2016 | Kuwabara et al. |
| 2016/0164165 | A1 | 6/2016 | Kwong et al. |
| 2016/0204366 | A1 | 7/2016 | Zhang et al. |
| 2016/0218156 | A1 * | 7/2016 | Shedletsky ............ H10K 59/60 |
| 2017/0287992 | A1 | 10/2017 | Kwak et al. |
| 2018/0040838 | A1 | 2/2018 | Zhai |
| 2018/0053455 | A1 * | 2/2018 | Zhang .................. H10K 77/111 |
| 2018/0081481 | A1 | 3/2018 | Fournier et al. |
| 2019/0212781 | A1 | 7/2019 | Fujimoto |
| 2020/0029423 | A1 | 1/2020 | Kwon et al. |
| 2020/0092407 | A1 | 3/2020 | Fournier et al. |
| 2020/0196496 | A1 | 6/2020 | Shin |
| 2020/0205307 | A1 | 6/2020 | Hooton et al. |
| 2022/0309980 | A1 | 9/2022 | Wang et al. |

FOREIGN PATENT DOCUMENTS

| | | | |
|---|---|---|---|
| CN | 107978626 | A | 5/2018 |
| CN | 108205970 | A | 6/2018 |
| CN | 109462958 | A | 3/2019 |
| CN | 110491295 | A | 11/2019 |
| CN | 209821559 | U | 12/2019 |
| EP | 3276469 | A1 | 1/2018 |
| JP | 2003271073 | A | 9/2003 |
| JP | 2005070660 | A | 3/2005 |
| JP | 2006078622 | A | 3/2006 |
| JP | 2007003874 | A | 1/2007 |
| JP | 2012011691 | A | 1/2012 |
| JP | 2012247770 | A | 12/2012 |
| JP | 2014035805 | A | 2/2014 |
| JP | 2014512556 | A | 5/2014 |
| JP | 2014127900 | A | 7/2014 |
| JP | 2015060904 | A | 3/2015 |
| JP | 2015145980 | A | 8/2015 |
| JP | 2015219387 | A | 12/2015 |
| JP | 2016061977 | A | 4/2016 |
| JP | 2016170404 | A | 9/2016 |
| JP | 3207091 | U | 10/2016 |
| JP | 2018113052 | A | 7/2018 |
| JP | 2018124327 | A | 8/2018 |
| JP | 2019516123 | A | 6/2019 |
| KR | 20150099329 | A | 8/2015 |
| KR | 20160022388 | A | 2/2016 |
| KR | 20180118332 | A | 10/2018 |
| KR | 20180121850 | A | 11/2018 |
| KR | 20190018553 | A | 2/2019 |
| KR | 102096221 | B1 | 4/2020 |
| KR | 20210073592 | A | 6/2021 |
| WO | 2014076852 | A1 | 1/2017 |

* cited by examiner

ELECTRONIC DEVICES WITH MOLDED POLYMER STRUCTURES

This application is a continuation of U.S. patent application Ser. No. 17/701,516, filed Mar. 22, 2022, which claims the benefit of provisional patent application No. 63/164,949, filed Mar. 23, 2021, and provisional patent application No. 63/229,259, filed Aug. 4, 2021, which are hereby incorporated by reference herein in their entireties.

FIELD

This relates generally to electronic devices, and, more particularly, to electronic devices with displays.

BACKGROUND

Electronic devices may have components such as displays. A housing for an electronic device with a display may have structures formed from materials such as glass and metal. In some configurations, displays may be mounted under display cover glass layers to protect display pixels from damage. The display cover glass may be attached to housing walls and other housing structures.

SUMMARY

An electronic device may have a display mounted in a housing. The display may have a display panel with an array of pixels on a flexible substrate. A display cover layer may overlap the display panel. The flexible substrate may have a protruding portion that forms a tail. When the display is mounted in the housing, the tail may be bent back on itself to create a bend. The bend may be embedded in a molded polymer member. The molded polymer member may help protect and support the embedded display tail.

The housing may have an inwardly protruding lip that runs around the periphery of the device. The lip may protrude from the sidewall of the housing into the molded polymer to help lock the molded polymer in place.

The housing may have a rear wall with an inwardly facing surface that faces an opposing inwardly facing surface of the display cover layer. The device may have structures that help prevent the display cover layer from being compressed towards the rear housing wall. These structures may include, for example, frame structures that extend between the inwardly facing surface of the rear housing wall to the opposing inwardly facing surface of the display cover layer. Vertical support may also be provided by vertical ribs that run along the inner surface of the sidewalls. In some configurations, the tail of the display may have parallel fingers each of which is received within a sidewall recess formed between pair of the vertical ribs or other inwardly protruding support structures.

The frame structures and other support structures may be embedded in the molded polymer. If desired, electrical components and other structures may be embedded in the molded polymer. For example, optical components and associated optical waveguides may be embedded within molded polymer. Mating chamfers on the display cover layer and housing may help seat the display cover layer in the housing.

DETAILED DESCRIPTION

An electronic device may have displays and other components. Layers of glass, metal, and/or other structures may be used in forming a housing for the device. The displays and other components may be mounted in the housing. Molded polymer may be used to support housing structures, displays, and other components. Portions of the housing structures, displays, and other components may be embedded in the polymer.

Figure 1:
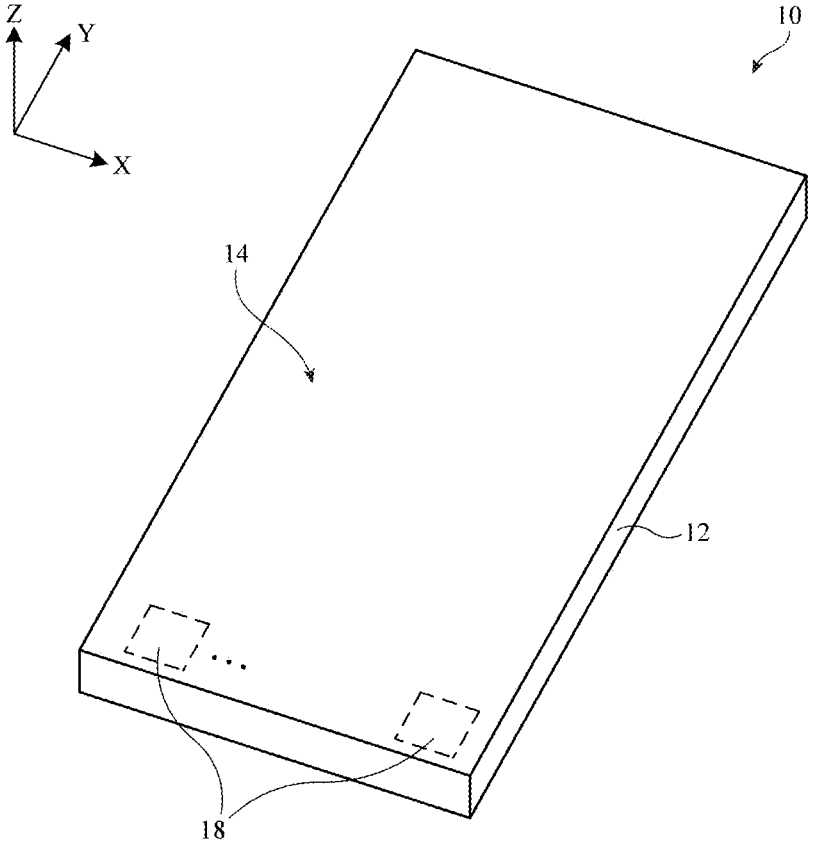
FIG. 1 is a perspective view of an illustrative electronic device with a display in accordance with an embodiment.

A perspective view of an illustrative electronic device of the type that may be provided with molded polymer structures is shown in FIG. 1. Device 10 of FIG. 1 may be a portable device such as a wristwatch, may be a portable device without a wristband such as a cellular telephone or tablet computer, or may be other suitable electronic equipment (e.g., a desktop computer, a voice-control speaker with a display panel, a television or other non-portable display, a head-mounted device, an embedded system such as a system built into a vehicle or home, an electronic device accessory, and/or other electronic device). Illustrative configurations in which device 10 is a cellular telephone or tablet computer may sometimes be described herein as an example.

As shown in FIG. 1, device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions in which internal device components 18 are mounted and may separate the interior region of device 10 from the exterior environment surrounding device 10. In some configurations, an opening may be formed in housing 12 for a data port, a power port, to accommodate audio components, or to accommodate other devices. Clear housing regions may be used to form optical component windows. In the illustrative arrangement of FIG. 1, a transparent housing layer may cover the upper surface of device 10 and may serve as a protective display cover layer for display 14. If desired dielectric housing structures may be used to form radio-transparent areas for antennas and wireless power components. Display 14 may be located on a front face of device 10 and may have a rectangular outline (e.g., a square or non-square rectangular shape with rounded corners or corners of other shapes, etc.), a circular outline, or other suitable shapes.

Electrical components 18 in the interior of device 10 may include integrated circuits, discrete components, light-emitting components, sensors, and/or other circuits and may, if desired, be interconnected using signal paths in one or more printed circuits. Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, optical touch sensors, optical proximity sensors, and/or other touch sensors and/or proximity sensors, monochromatic and color ambient light sensors, image sensors, fingerprint sensors, ultrasonic sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 (e.g., components 18) may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays such as display 14 (e.g., a display that includes a two-dimensional capacitive touch sensor and/or other touch sensor or a display that is insensitive to touch). The displays may, for example, include an organic light-emitting diode display, a liquid crystal display, a display having an array of pixels formed from respective light-emitting diodes (e.g., a pixel array having pixels with light-emitting diodes formed from respective crystalline light-emitting diode dies such as micro-light-emitting diode dies), and/or other displays. The displays may include rigid display structures and flexible display structures. For example, a light-emitting diode display may have a polymer substrate that is sufficiently flexible to be bent. Display 14 may have a rectangular pixel array or a pixel array of another shape for displaying images for a user and may therefore sometimes be referred to as a pixel array. Display 14 and/or portions of display 14 may also sometimes be referred to as a display panel, display layer, or pixel layer. Each pixel array in device 10 may be mounted under a transparent housing structure (sometimes referred to as a transparent display cover layer, protective cover layer structures, etc.).

Figures 2, 3, 4, 5:
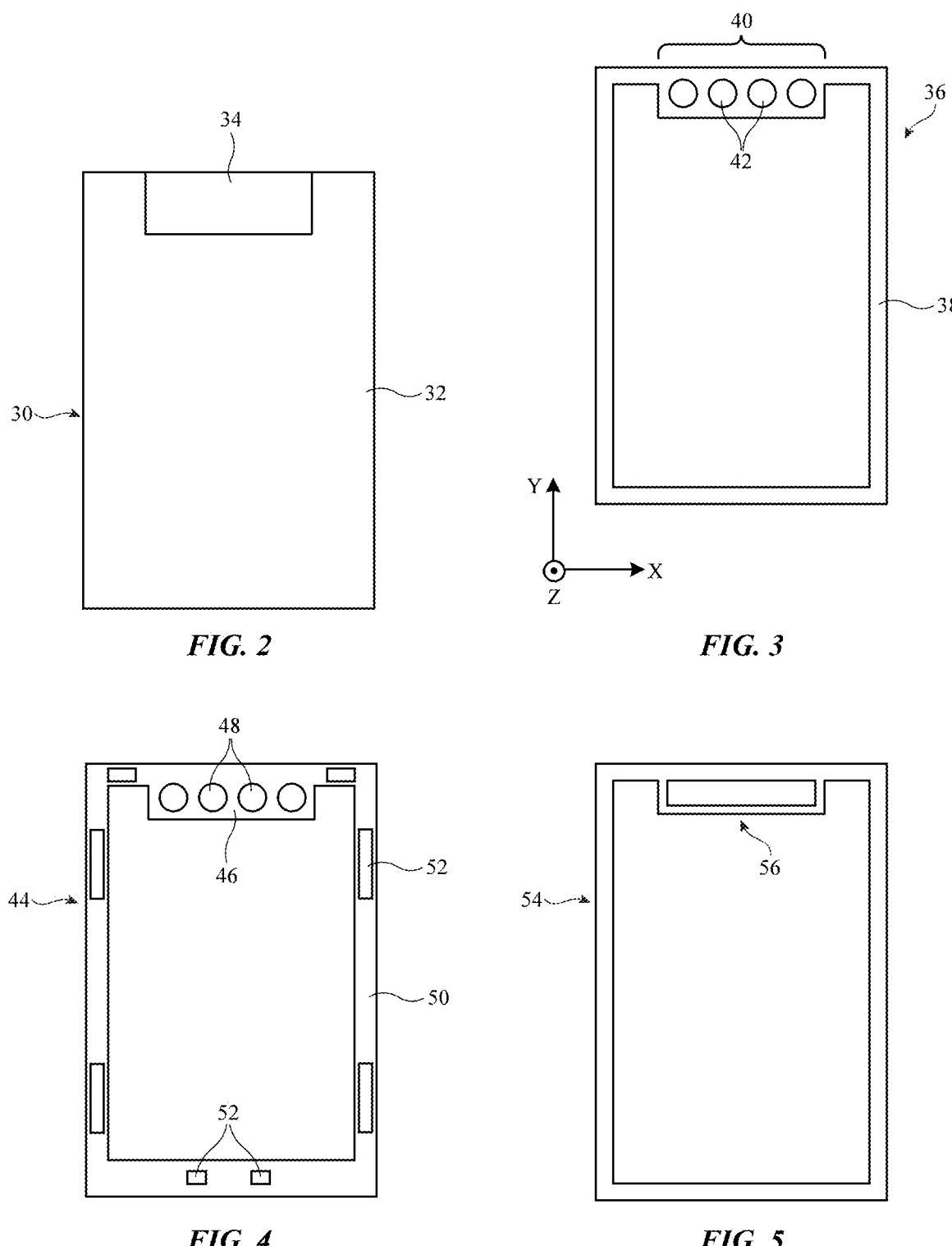
FIGS. 2, 3, 4, and 5 are top views of illustrative display and housing structures that may be stacked together in an electronic device in accordance with an embodiment.

FIGS. 2, 3, 4, and 5 show top views of illustrative structures that may be assembled together (e.g., by stacking, etc.) within device 10. Illustrative display assembly 30 of FIG. 2 has a display panel portion 32 (e.g., a display cover layer, an array of pixels for displaying images, etc.) and has notch portion 34 (e.g., an inactive area that is free of pixels and that has one or more transparent portions to pass light associated with optical components such as cameras, ambient light sensors, three-dimensional sensors, proximity sensors, etc.). One or more layers of adhesive such as illustrative pressure-sensitive adhesive 36 of FIG. 3 may be used in mounting structures to display assembly 30 and/or to housing structures (e.g., a rear housing wall member, etc.). In the example of FIG. 3, adhesive 36 includes an outer ring such as ring 38 that is configured to run along the periphery of device 10 and includes notch portion 40 with openings 42 to accommodate components.

FIG. 4 is a diagram of an illustrative frame (sometimes referred to as a frame member, support structure, or internal housing structure) for device 10. As shown in FIG. 4, frame 44 may include ring-shaped portion 50 with protruding tabs 52. Tabs 52, which may extend out of the page in the orientation of FIG. 4, may have openings and/or other engagement structures that allow tabs 52 to be used to help attach frame 44 to other portions of device 10. Frame 44 may be formed from stainless steel and/or other metal(s), may be formed from polymer, and/or may be formed from other suitable materials. Portion 46 of frame 44 may have openings 48 into which respective components are mounted (e.g., optical components such as cameras, ambient light sensors, three-dimensional sensors, proximity sensors, etc.). These components may receive light that passes through transparent regions in notch portion 34 of FIG. 2 and openings 42 of FIG. 3. Frame 44 may, in an illustrative configuration, be attached to housing structures in device 10 or structures such as display assembly 30 of FIG. 2 using adhesive 36 of FIG. 3.

Figure 6:
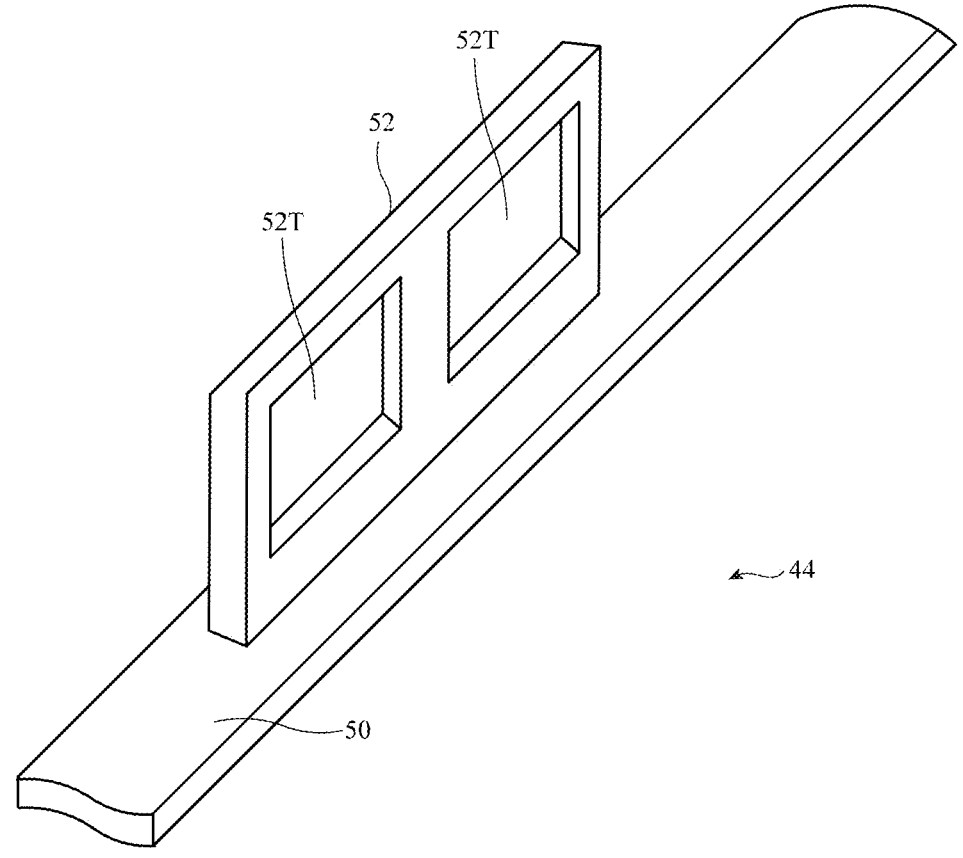
FIG. 6 is a perspective view of a portion of an illustrative frame with a tab in accordance with an embodiment.

During injection molding operations, polymer such as molded polymer 54 of FIG. 5 may be molded over structures in device 10 (e.g., some or all of frame 44, etc.). Ring-shaped portion 56 of polymer 54 may surround notch portion 34 of FIG. 2. Portions of frame 44 such as tabs 52 may be left uncovered and/or may be partially covered with molded polymer. For example, tabs such as illustrative tab 52 of FIG. 6 may be uncovered or only partially covered so that tab openings 52T remain open and uncovered with polymer. This allows tab openings 52T and/or other tab structures in frame 44 to be used to engage with mating housing members when device 10 is assembled (e.g., openings 52T may receive protruding housing sidewall structures, etc.).

Display 14 may have a tail portion. The tail of display 14 (e.g., the tail of a flexible display panel substrate on which the pixel array of display 14 is formed) may be used to carry data signals, clock signals and other control signals, power signals, and/or other display signals from components 18 (e.g., display driver integrated circuits, etc.) to the pixel array of the display that is used in displaying images. The tail of display 14 may be formed from a protruding elongated strip of flexible polymer (e.g., polyimide) or other display substrate material (e.g., an integral portion of the pixel array substrate). To fit the tail within housing 12, the tail may be bent. For example, the tail of the display may be bent back on itself (e.g., by 180°). This helps ensure that any border structures surrounding display 14 may be relatively narrow.

Figure 7:
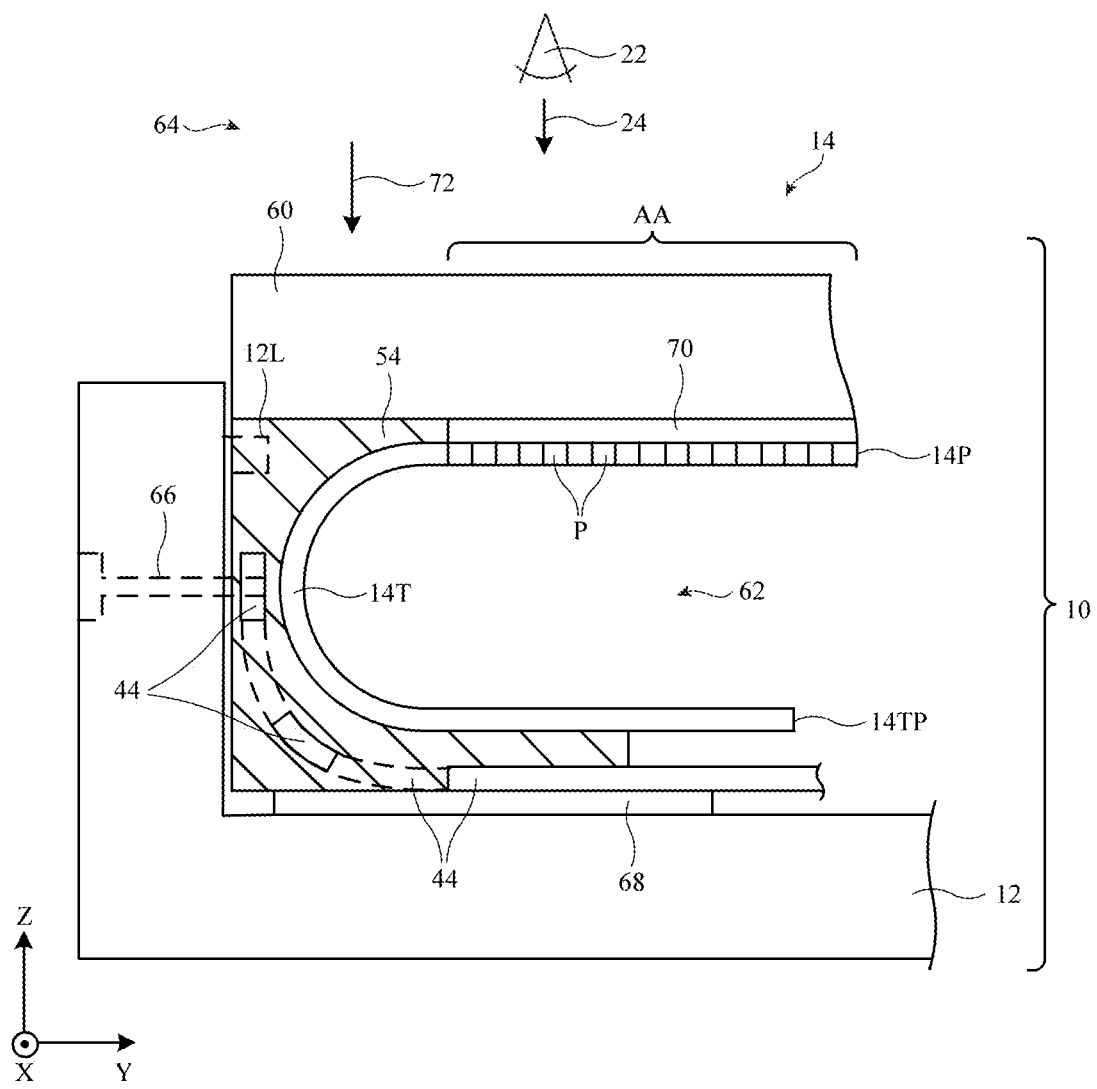
FIG. 7 is a cross-sectional side view of an end portion of an illustrative electronic device in accordance with an embodiment.

As shown in FIG. 7, display 14 may have a display panel such as display panel 14P with an array of pixels P forming active area AA. During operation of device 10, images may be displayed in active area AA. Display 14 may have an associated protective cover layer such as transparent display cover layer 60. Display cover layer 60 may be formed from one or more layers of glass, clear polymer, crystalline material such as sapphire or other crystalline material, and/or other transparent structures(s). The presence of layer 60 may help protect the outer surface of display panel 14P from scratches.

Display panel 14P may include a protruding tail portion such as tail 14T (e.g., a flexible tail that protrudes from the left edge of rectangular active area AA towards the left in the example of FIG. 7). When display 14 is mounted in housing 12, tail 14T may be bent back on itself as shown in FIG. 7. This may help minimize the size of any inactive display border that is visible by a user such as viewer 22 who is viewing display 14 in direction 24. Display control circuitry (e.g., display driver and timing control circuitry) may be formed from thin-film circuitry and/or integrated circuits mounted on and/or electrically coupled to portion 14TP of tail 14T (as an example).

Housing 12 and display cover layer 60 serve to enclose interior region 62 and separate interior region 62 from exterior region 64 surrounding device 10. Components 18 (FIG. 1) may be mounted within interior region 62. As shown in FIG. 7, molded polymer 54 may be used in supporting tail 14T and other structures in device 10. Molded polymer 54 may, as shown in FIG. 7, be molded over frame 44. Frame 44 may have portions (e.g., screw holes) that are threaded and/or otherwise configured to receive threaded fasteners such as screw 66. Screws such a screw 66 may pass through openings in housing 12 and may screw into the threaded portions of frame 44 to help mechanically attach housing 12 to frame 44. Adhesive such as pressure sensitive adhesive 68 may be used in attaching frame 44 to housing 12, if desired. Adhesive such as optically clear adhesive 70 may be used in attaching display panel 14P to the inwardly facing surface of display cover layer 60.

With an arrangement of the type shown in FIG. 7, frame 44 may help provide internal structural support for device 10 and may use tabs and/or other engagement structures to help attach frame 44 to housing walls and other portions of housing 12. Frame 44 may have one or more portions embedded in molded polymer 54. This may help secure frame 44 to polymer 54. The strength added by frame 44 may help device 10 avoid deformation and damage (e.g., during a drop event that might, as an example, impose inward force on display cover layer 60 in direction 72.

If desired, one or more portions of housing 12 may be configured to help engage molded polymer 54. As shown in FIG. 7, for example, housing 12 may have a lip-shaped portion such as lip 12L. Lip 12L may be a ring-shaped lip running around some or all of the periphery of device 10. Lip 12L, which may protrude laterally inwardly towards interior 62 from the inner side of a sidewall of housing 12, may help to engage and thereby lock polymer 54 in place (e.g., lip 12L may serve as a locking lip that locks polymer 54 to housing 12).

Figure 8:
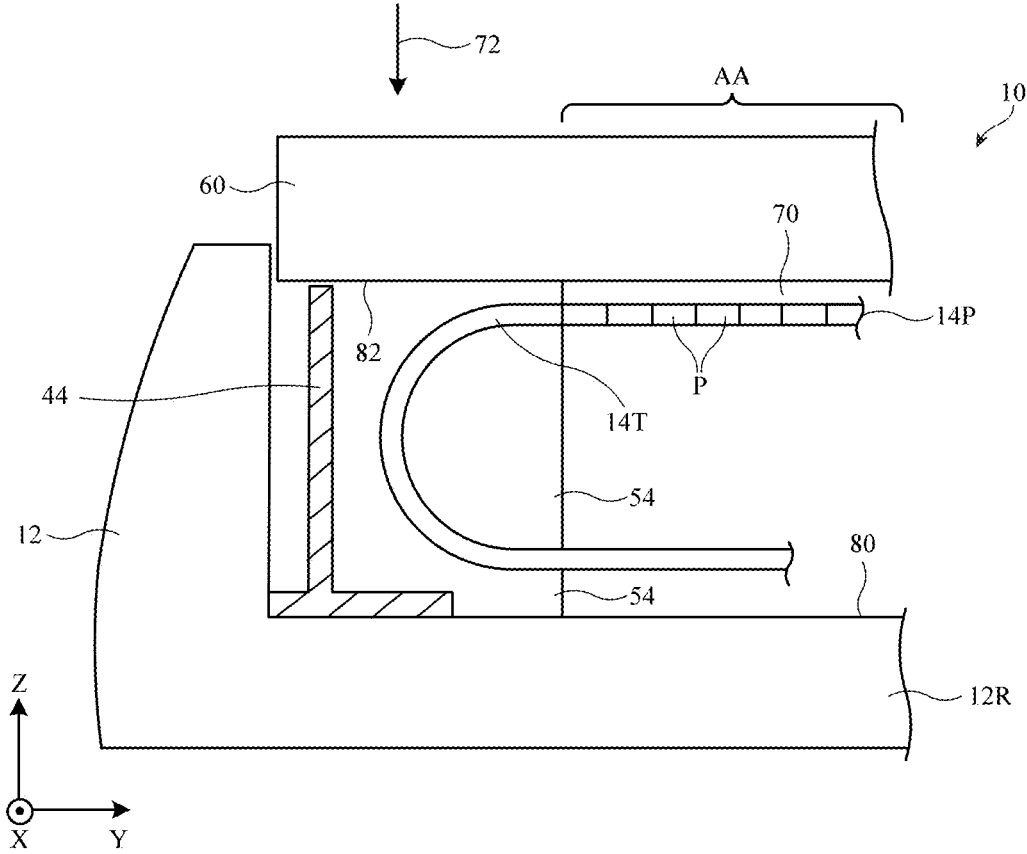
FIG. 8 is a cross-sectional side view of an end portion of an illustrative electronic device with a frame configured to help support a display cover layer in accordance with an embodiment.

FIG. 8 is a cross-sectional side view of device 10 showing how device 10 may include support structures that help support display cover layer 60. In the example of FIG. 8, frame 44 has a vertically-extending portion that extends between inwardly facing surface 80 of rear housing wall 12R of housing 12 and opposing inwardly facing surface 82 of display cover layer 60. The presence of the vertical supporting structures of frame 44 between surfaces 80 and 82 serves to maintain a desired minimum separation between surfaces 80 and 82 and helps prevent over-compression of polymer 54 when force is applied on display cover layer in direction 72 due to an undesired drop event or other impact.

Figure 9:
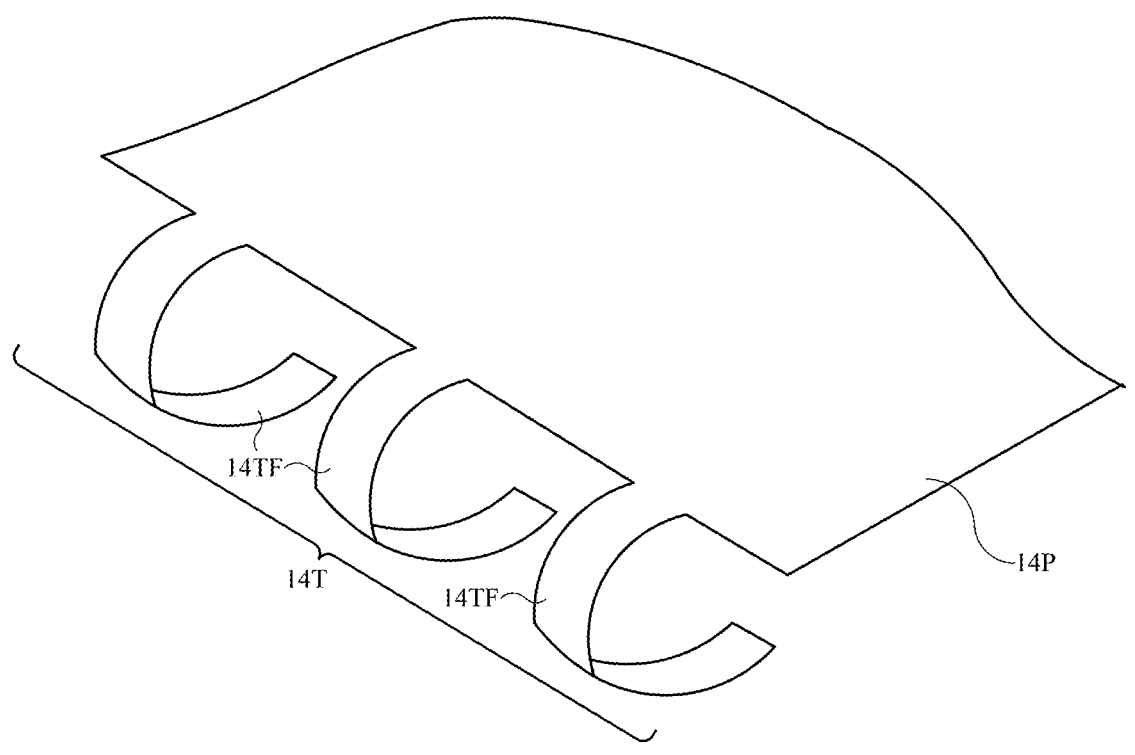
FIG. 9 is a perspective view of a segmented tail portion of an illustrative flexible display in accordance with an embodiment.

To help minimize the width of inactive display borders, it may be desirable for tail 14T to extend within recessed portions at the edge of housing 12. This allows the size of active area AA to be enlarged without narrowing the width of the sidewall structures along the entire end of housing 12. To mount display 14 in this type of housing, tail 14T may, if desired, be segmented across its width so that tail 14T of display panel 14P has multiple parallel bent fingers such as fingers 14TF of FIG. 9.

Figure 10:
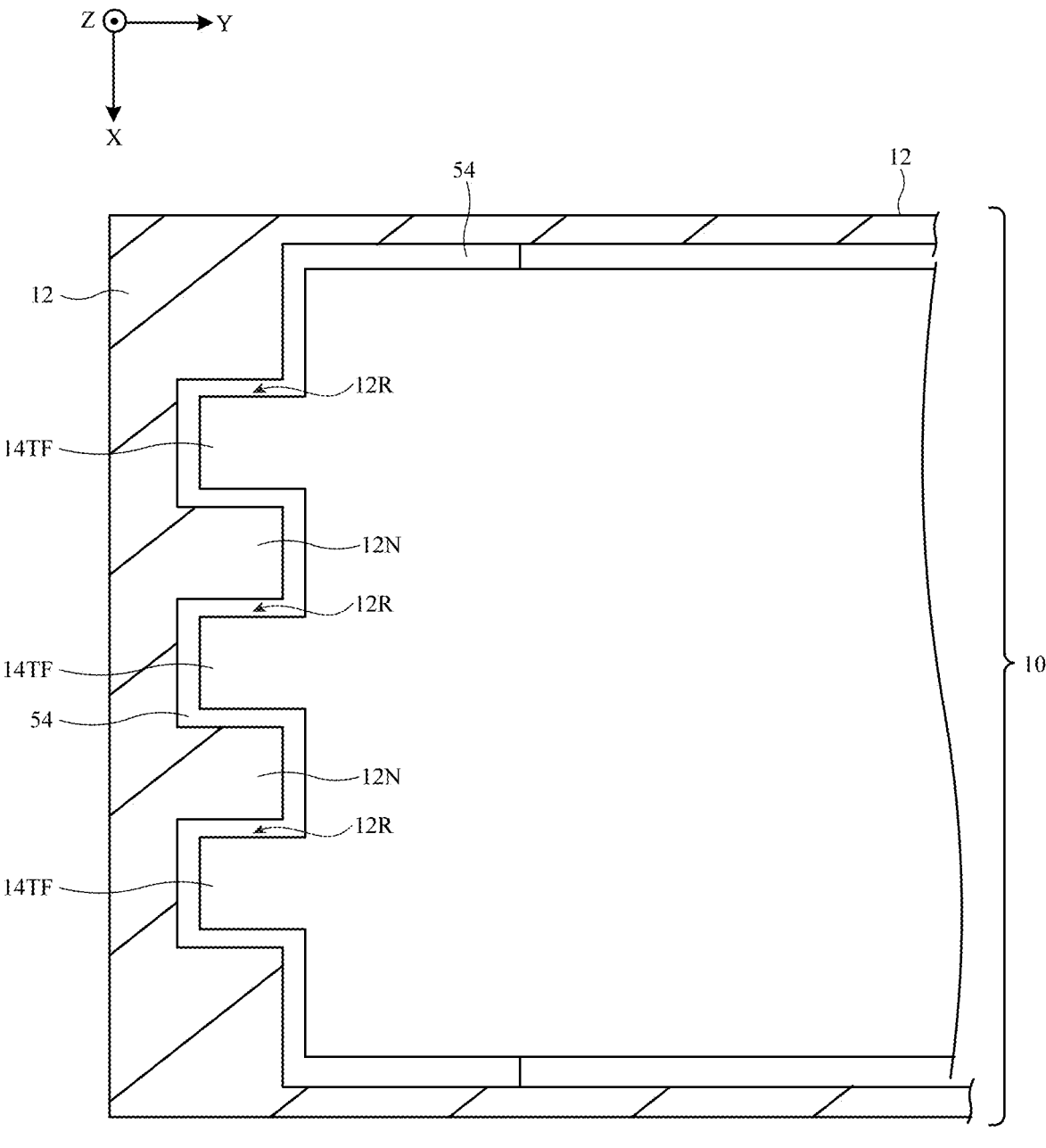
FIG. 10 is a top view of an end portion of an illustrative electronic device in which a flexible display of the type shown in FIG. 9 has been mounted.
Figure 11:
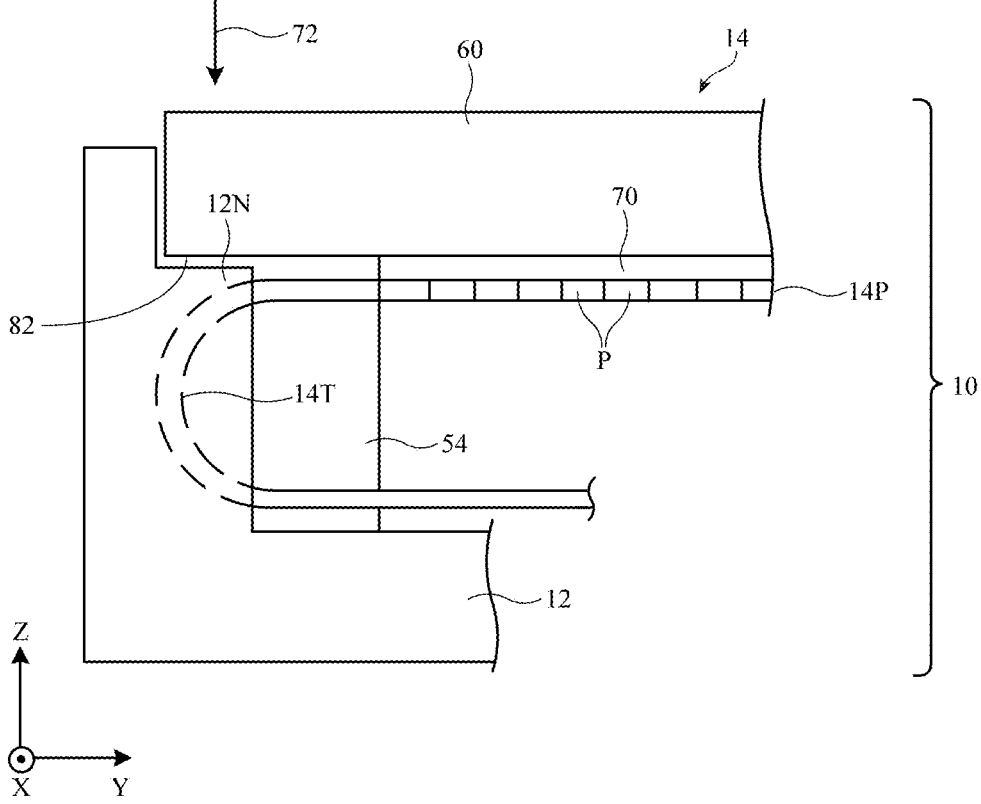
FIG. 11 is a cross-sectional side view of the end portion of the illustrative electronic device of FIG. 10 in accordance with an embodiment.

As shown in the top view of housing 12 of FIG. 10, housing 12 (e.g., the wall of housing 12 adjacent to tail 14T) may be provided with recesses 12R that are each configured to receive a laterally protruding portion of a respective one of fingers 14TF. In the example of FIG. 10, each finger 14TF is bent back on itself within a respective recess 12R. Non-recessed portions 12N of the wall of housing 12, which are formed from vertically extending ribs that run parallel to the Z axis along the inner surface of the sidewall of housing 12, protrude laterally inwardly (e.g., in the Y direction of FIG. 10) from the sidewall of housing 12 and are each located between a respective pair of fingers 14TF. In the absence of the vertical supports formed from protruding portions 12N of housing 12, the wall of housing 12 would be uniformly thinner to accommodate tail 14T. This thinner size for the wall of housing 12, could reduce the strength of housing 12. In arrangements in which protruding portions 12N are present, however, these protruding portions serve as vertical supports extending between the rear wall of housing 12 and inner surface 82 of display cover layer 60. This is shown in FIG. 11, which is a cross-sectional side view of device 10 of FIG. 10. As this example demonstrates, providing a housing sidewall with one or more recesses to receive one or more corresponding fingers 14TF of tail 12T allows the inactive border width of display 14 to be reduced while maintaining desired vertical support (resistance to excessive forces in direction 72 due to portions 12N which form ridges that run vertically parallel to the Z axis along the inner surface of the sidewall of housing 12).

Figure 12:
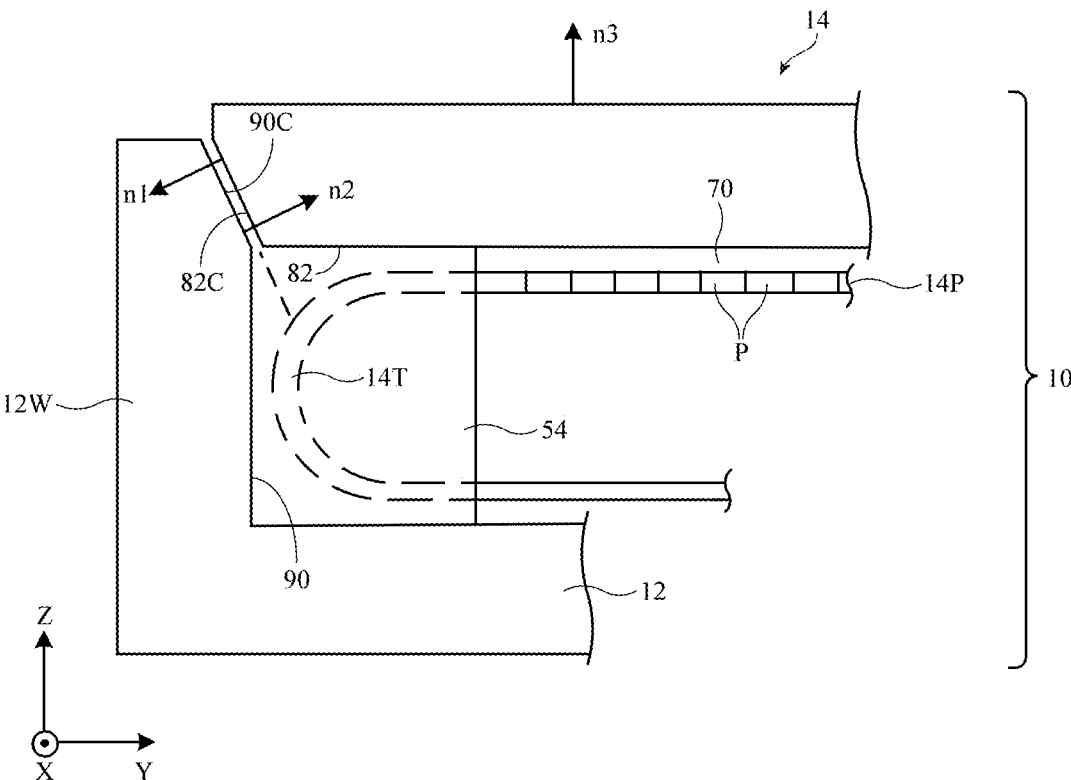
FIG. 12 is a cross-sectional side view of an end portion of an illustrative electronic device in accordance with an embodiment.

If desired, inner surface 82 of display cover layer 60 may be provided with an angled surface that mates with a corresponding angled surface of housing 12. As shown in FIG. 12, for example, housing 12 may have a sidewall such as sidewall 12W. Sidewall 12W may run along the rectangular periphery of device 10. Sidewall 12W may have a chamfer that forms angled surface 90C at the top of inwardly-facing side surface 90 of sidewall 12W. The chamfered portion of sidewall 12W may be matched by a corresponding chamfered portion of display cover layer 60. As shown in FIG. 12, for example, inner surface 82 of display cover layer 60 may have a chamfer along its peripheral edge that forms angled (chamfered) surface 82C.

Surface normal n1 of surface 82C and surface normal n2 of surface 90C may be parallel to each other and oriented at non-zero angles (e.g., an angle with a value of at least 10°, at least 30°, less than 90°, less than 70°, or other suitable value) with respect to vertical axis Z (which is parallel to the surface normal n3 of the outer surface of display cover layer 60). The angled orientations of surfaces 82C and 90C may help prevent display cover layer 60 from being pushed inwardly to compress (and potentially damage) polymer 54 when subjected to external force in direction 72 (e.g., force due to an undesired drop event). At the same time, the arrangement of FIG. 12 helps seat display cover layer 60 within the housing perimeter formed by sidewall 12W so that layer 60 does not slip laterally across the top of sidewall 12W.

Figure 13:
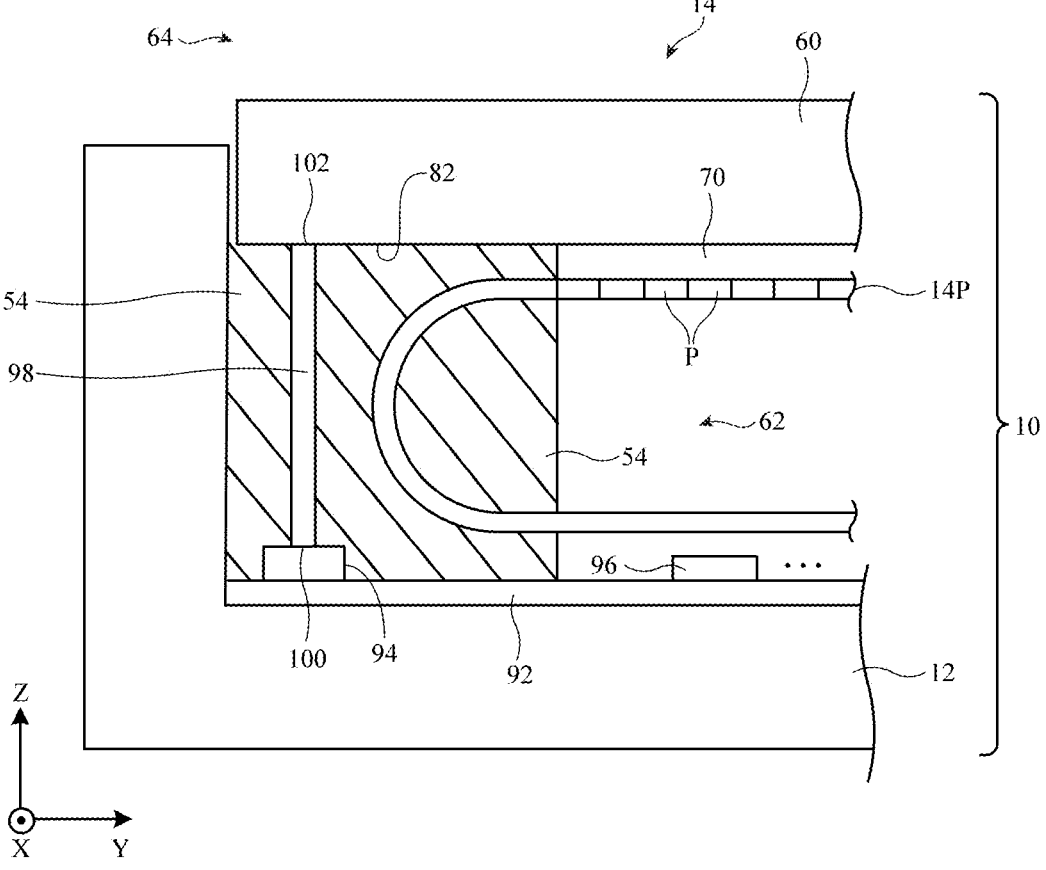
FIG. 13 is a cross-sectional side view of an end portion of an illustrative electronic device with an optical component and light guide embedded in a polymer structure in accordance with an embodiment.

If desired, components (e.g., components 18 of FIG. 1) may be embedded within polymer 54. Consider, as an example, the illustrative arrangement shown in the cross-sectional side view of device 10 of FIG. 13. As shown in FIG. 13, components may be mounted in interior region 62 of device 10. These components may include components such as components 94 and 96 (e.g., components 18 of FIG. 1 such as integrated circuits, sensors, input-output devices, etc.). Printed circuits such as printed circuit 92 and/or other signal paths may be used to electrically interconnect components 94 and 96.

Display 14 may have a display panel 14P that is attached to the underside (surface 82) of display cover layer 60 with adhesive 70. Molded polymer 54 may surround portions of bent tail 14T of display panel 14P. Component 94 may, if desired, be an optical component such as a component that emits light and/or a component that senses light. Light may be emitted and/or detected by component 94 at any suitable wavelength (e.g., infrared, visible, and/or ultraviolet). To help guide light to a desired location, device 10 may have optical waveguide structures. As shown in FIG. 13, for example, light guide 98 may be fully or partially embedded in polymer 54. Light guide 98 may be formed from a transparent elongated light guide structure (e.g., a transparent elongated cylinder or other light guide formed from polymer and/or glass that guides light along its length). In an illustrative configuration, light guide 98 includes a core surrounded by a cladding with a lower refractive index than the core. If desired, polymer 54 may serve as a cladding layer. These types of arrangements and/or other light guide arrangements may be used to support light guiding through light guide 98 in accordance with the principal of total internal reflection.

During operation, optical component 94 may produce light that is received at light guide end face 100 of light guide 98 and that is emitted out of light guide 98 at opposing end face 102 (e.g., so that the emitted light may pass through layer 60) and/or light may be received at end face 102 (e.g., after passing through layer 60) and guided to end face 100 through light guide 98 for sensing by component 94. If desired, light guide 98 may have one or more bends along its length. Component 94, which may form one of the sensors for device 10 and/or which may serve as an output component or other input-output device for device 10 may contain one or more light-emitting devices such as light-emitting diodes and/or lasers and one or more light detectors such as photodiodes, image sensors, etc.

Polymer 54 may be any suitable polymer material such as a thermoset polymer (e.g., light-cured polymer, thermally cured polymer, etc.) or thermoplastic polymer (e.g., a thermoplastic polymer that has been softened and reduced in viscosity by heating during molding). Molding operations for polymer 54 may be performed using applied pressure from mating pieces in a mold die to shape the polymer and/or using injection molding (e.g., under vacuum conditions, using applied high or low pressure to the polymer material being molded, etc.).

Figure 14:
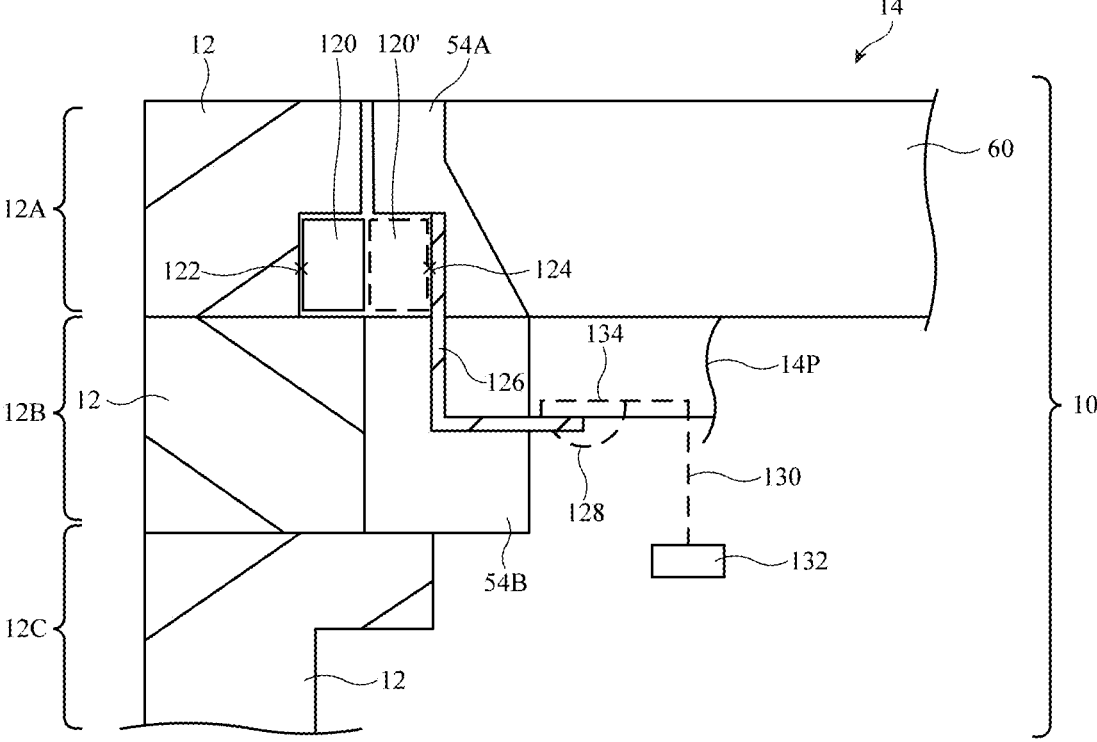
FIG. 14 is a cross-sectional side view of an edge portion of an illustrative electronic device in accordance with an embodiment.

If desired, electrical connections may be formed through molded polymer structures in device 10. Consider, as an example, the arrangement of FIG. 14. As shown in FIG. 14, housing 12 of device 10 may have conductive portions such as metal housing portion 12A and metal housing portion 12C that are at least partly separated by a dielectric portion such as dielectric portion 12B. Portion 12B may be formed from polymer or other insulator and may have a full or partial ring shape such as an O-shape, C-shape, or other shape that runs along at least part of the periphery of device 10 (e.g., along at least three sides of a rectangular periphery for device 10 that surrounds a rectangular display).

It may be desirable to use conductive structures in device 10 such as metal housing portions 12A and/or 12C to form antenna structures. As an example, radio-frequency antenna signals for wireless communications, satellite navigation system signals, and/or other wireless communications signals may be transmitted and/or received by device 10 using one or more antennas formed from housing portions 12A and 12C, display 14P (e.g., metal traces 134 on a printed circuit substrate potion of display panel 14P) and/or other conductive structures in device 10.

Conductive paths may be formed between wireless communications circuitry 132 and the antenna structures of device 10. Circuitry 132 may include, for example, radio-frequency transceiver circuitry, low-noise-amplifier circuitry, power amplifier circuitry, baseband processor circuitry, filter circuitry, impedance matching circuitry, tuning circuitry, etc. As shown in FIG. 14, circuitry 132 may be electrically coupled to metal traces 134 in display panel 14P using signal paths such as path 130 (and may, if desired, be electrically coupled to conductive structures such as housing portion 12C, printed circuit board ground planes, and/or other conductive structures in device 10 using additional signal paths). These signal paths may be formed using metal traces on printed circuits, laser-direct-structuring metal traces on polymer members, conductive polymer shots in molded polymer structures, metal members, wires, and/or m other conductive path structures.

In an illustrative configuration, metal housing portion 12A may be electrically coupled to metal traces 134 in display panel 14P and these metal structures may operate together to form at least part of an antenna. Traces 134 may be electrically connected to metal housing portion 12A using a conductive path formed from metal structure 126 and spring 120. Spring 120 may be a wave spring with a ring shape that runs around some or all of the periphery of display 14. Periodically, the wave spring undulates outwardly and, in the position shown by spring 120 of FIG. 14, presses against metal housing member 12A to form electrical connection 122. Periodically, the wave spring undulates inwardly and, in position 120', presses against the outer surface of metal structure 126 to form electrical connection 124. In this way, metal housing portion 12A is shorted to metal structure 126. There may be any suitable number of connections such as connections 122 and 124 in device 10. As an example, there may be between 3 and 10 discrete connection points between spring 120 and housing 12A and between 3 and 10 discrete connection points between spring 120 and structure 126 around the periphery of device 10.

Metal structure 126 may be formed from a single metal ring that runs around some or all of the periphery of display 14. This single metal ring may be at least partly embedded in molded polymer (see, e.g., molded polymer 54A and molded polymer 54B, which may be formed as integral portions of a common molded part or may be formed separately). If desired, a set of discrete metal inserts may be used in place of the single metal ring. Metal structure 126 may, as an example, be formed from 3-8 separate metal inserts that are spaced at regular intervals around the periphery of display 14. The metal inserts may also be at least partly embedded in molded polymer 54A and/or 54B. As described in connection with FIG. 7, tail portion 14T of display panel 14P may be embedded in the molded polymer (e.g., in molded polymer 54B).

Metal traces 134 may form one or more connections with metal structure 126 and/or a separate structure such as copper tape or other conductive material (see, e.g., path 128) may be used in connect traces 134 and metal structure 126. In general, electrical connections between conductive structures in device 10 may be formed using direct contact, conductive adhesive, solder, welds, metal fasteners, and/or other suitable electrical connection structures.

By using connections of the type shown in FIG. 14, metal housing portion 12A (e.g., a ring-shaped metal housing structure that runs along the periphery of display 14) may, in combination with metal traces 134 associated with the display panel 14P, form at least part of an antenna for device 10. Use of metal housing portion 12A and display panel 14P to form an antenna may help avoid use of overly bulky antenna structures in device 10 and may therefore help maintain a desired compact size for device 10.

The arrangements shown in FIGS. 1-14 may be used independently and/or any suitable number of these arrangements (e.g., one or more) may be used in combination with each other.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
a display layer having a bent tail;
a housing wall comprising a first inwardly facing surface and a second inwardly facing surface; and
molded polymer coupled to the first and second inwardly facing surfaces, wherein at least a portion of the bent tail is embedded in the molded polymer.

2. The electronic device of claim 1, wherein the molded polymer comprises a ring-shaped polymer structure running along a peripheral edge of the display layer.

3. The electronic device of claim 2, further comprising a frame that is at least partially embedded in the ring-shaped polymer structure.

4. The electronic device of claim 3, further comprising a threaded fastener, wherein the frame comprises at least one threaded opening configured to receive the threaded fastener.

5. The electronic device of claim 4, wherein the housing wall comprises an opening that receives the threaded fastener.

6. The electronic device of claim 1, wherein the housing wall has a recessed portion on the first inwardly facing surface that is configured to receive the bent tail.

7. The electronic device of claim 1, wherein the housing wall has a locking lip that protrudes inwardly into the molded polymer.

8. The electronic device of claim 1, further comprising a frame that is at least partially embedded in the molded polymer.

9. The electronic device of claim 1, wherein the bent tail comprises opposing first and second surfaces, a first portion of the molded polymer is coupled to the first surface, and a second portion of the molded polymer is coupled to the second surface.

10. An electronic device, comprising:
a display layer having an array of pixels and opposing first and second surfaces;

a display cover layer having an inwardly facing display cover layer surface that overlaps the display layer;

a housing having an inwardly-facing housing surface; and a molded polymer coupled to the inwardly-facing housing surface, wherein a portion of the display layer is embedded within the molded polymer, a first portion of the molded polymer is coupled to the first surface, and a second portion of the molded polymer is coupled to the second surface.

11. The electronic device of claim 10, wherein the molded polymer is coupled to the display cover layer.

12. The electronic device of claim 11, wherein the inwardly-facing housing surface is a sidewall surface, the housing further comprises a rear wall, and the molded polymer extends from the rear wall to the display cover layer.

13. The electronic device of claim 10, wherein the portion of the display layer comprises a bent tail.

14. The electronic device of claim 10, wherein the inwardly-facing housing surface is a first inwardly-facing housing surface, the housing further comprises a second inwardly-facing housing surface, and the molded polymer is coupled to the first and second inwardly-facing housing surfaces.

15. The electronic device of claim 10, further comprising:

a frame that is at least partially embedded in the molded polymer.

16. The electronic device of claim 15, wherein the frame comprises a metal frame.

17. An electronic device, comprising:

a housing wall comprising an inwardly facing surface;

molded polymer coupled to the inwardly facing surface;

a display layer having a bent tail, wherein a portion of the bent tail is embedded in the molded polymer; and a frame, wherein the molded polymer is coupled to the frame, and the frame is coupled to the housing wall with a fastener.

18. The electronic device of claim 17, wherein the molded polymer is molded over the frame.

19. The electronic device of claim 17, wherein the inwardly facing surface is a first inwardly facing surface, the housing wall further comprises a second inwardly facing surface, and the frame is coupled to the second inwardly facing surface with the fastener.

20. The electronic device of claim 19, wherein the fastener comprises a threaded fastener.

\* \* \* \* \*